United States Patent
Ramirez et al.

(10) Patent No.: US 7,891,078 B1
(45) Date of Patent: Feb. 22, 2011

(54) SENSOR-BASED FEEDBACK METHOD FOR IMPROVED ASSEMBLY OF VACUUM ELECTRONIC DEVICES

(75) Inventors: Ayax D. Ramirez, Chula Vista, CA (US); Stephen D. Russell, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 583 days.

(21) Appl. No.: 11/970,324

(22) Filed: Jan. 7, 2008

(51) Int. Cl.
*G01R 3/00* (2006.01)
(52) U.S. Cl. .......................... 29/595; 29/592.1; 29/593; 29/594; 342/165; 324/165; 324/173; 324/174
(58) Field of Classification Search ........... 29/593–595; 342/165; 324/165, 173, 174
See application file for complete search history.

(56) References Cited

U.S. PATENT DOCUMENTS

| 6,697,014 B1 * | 2/2004 | Ramirez et al. ............. 342/165 |
| 6,899,766 B2 | 5/2005 | Miya et al. |
| 6,920,680 B2 | 7/2005 | Wei et al. |
| 6,986,381 B2 | 1/2006 | Ray et al. |
| 7,017,636 B2 | 3/2006 | Shiozawa |
| 7,181,071 B2 * | 2/2007 | Kim et al. .................... 382/236 |
| 2006/0057505 A1 | 3/2006 | Sadwick et al. |
| 2007/0057186 A1 | 3/2007 | Nakasuji et al. |

* cited by examiner

*Primary Examiner*—Paul D Kim
(74) *Attorney, Agent, or Firm*—Kyle Eppele; J. Eric Anderson; Ryan J. Friedl

(57) ABSTRACT

A method of improving efficiency of manufacturing a vacuum electronic device, includes placing sensors on the device's interior during its construction and obtaining a first measured characteristic value; comparing the first measured characteristic value with a desired characteristic value; determining whether the first measured characteristic value is within a predetermined percentage of the desired characteristic value; adjusting a component of the device and measuring the characteristic of the device to obtain a second measured characteristic, comparing the second measured characteristic value with a desired characteristic value, determining whether the second measured characteristic value is within a predetermined percentage of the desired characteristic value; and repeating the previous step until the second measured characteristic value is within the predetermined percentage of the desired characteristic value.

9 Claims, 4 Drawing Sheets

SENSOR-BASED FEEDBACK METHOD FOR IMPROVED ASSEMBLY OF VACUUM ELECTRONIC DEVICES

FEDERALLY-SPONSORED RESEARCH AND DEVELOPMENT

This invention (Navy Case No. 97,186) was developed with funds from the United States Department of the Navy. Licensing inquiries may be directed to Office of Research and Technical Applications, Space and Naval Warfare Systems Center, San Diego, Code 2112, San Diego, Calif., 92152; telephone (619) 553-2778; email: T2@spawar.navy.mil.

FIELD OF THE INVENTION

The inventive subject matter is related to a condition-based maintenance system being tested both in-house and at microwave tube test sites. The inventive subject matter is also directed toward a method and apparatus for improved assembly of vacuum electronic devices such as microwave power tubes.

SUMMARY OF THE INVENTION

An embodiment of the inventive subject matter is a method of improving efficiency of the process of manufacturing a vacuum electronic device. The method includes the steps of a) placing a plurality of first sensors on an interior of the vacuum electronic device during construction of the vacuum electronic device and measuring a characteristic, such as an acoustic emission signal of a given amplitude, integrated energy or frequency range, to obtain a first measured characteristic value; b) comparing the first measured characteristic value with a desired characteristic value; c) determining whether the first measured characteristic value is within a predetermined percentage of the desired characteristic value; d) adjusting at least one component of the vacuum electronic device and measuring the characteristic of the vacuum electronic device to obtain a second measured characteristic, comparing the second measured characteristic value with a desired characteristic value determining whether the second measured characteristic value is within a predetermined percentage of the desired characteristic value; e) repeating step d until the second measured characteristic value is within the predetermined percentage of the desired characteristic value; and f) removing the plurality of first sensors and completing the process of manufacturing the vacuum electronic device. If the first measured characteristic is within a predetermined value, there is no need to continue measuring the characteristic unless a person wishes to verify the first measured characteristic. For example, to speed up the manufacturing process, a device whose resonance falls within a predetermined percentage of the desired characteristic value can move directly to step f from step c. The characteristic may include, for example, the frequency range of an acoustic emission signal, the amplitude of an acoustic emission signal, the spectral (frequency) components of an acoustic emission signal, or the integrated energy of an acoustic emission signal.

The inventive method can also include the additional steps of placing a plurality of second sensors on an exterior of the vacuum electronic device during construction of the vacuum electronic device and measuring a characteristic of the vacuum electronic device to obtain a first exterior measured characteristic value; comparing the first exterior measured characteristic value with a desired characteristic value; determining whether the first exterior measured characteristic value is within a predetermined percentage of the desired characteristic value; adjusting at least one component of the vacuum electronic device and measuring the characteristic of the vacuum electronic device to obtain a second exterior measured characteristic value, comparing the second exterior measured characteristic value with a desired characteristic value determining whether the second exterior measured characteristic value is within a predetermined percentage of the desired characteristic value (then repeating this step until the second exterior measured characteristic value is within the predetermined percentage of the desired characteristic value); and removing the plurality of second sensors and completing the process of manufacturing the vacuum electronic device. The characteristic may include, for example, the frequency range of an acoustic emission signal, the amplitude of an acoustic emission signal, the spectral components of an acoustic emission signal, or the integrated energy of an acoustic emission signal.

With respect to the equipment used in this embodiment, the plurality of sensors used in this method can be acoustic emission sensors. Also, the characteristic can be caused by applying an RF signal to the vacuum electronic device which generates an acoustic emission signal.

The inventive subject matter can also be embodied in a system for maintaining operating efficiency of a vacuum electronic device having a plurality of components. The system includes a plurality of sensors disbursed throughout an interior of the vacuum electronic device (each of the plurality of sensors is adapted to detect a characteristic of the vacuum electronic device such as a resonant frequency); a signal emitter adapted to create microwave emission in the vacuum electronic device; a controller configured to receive from each of the plurality of sensors a value indicative of the microwave emission of the vacuum electronic device and further configured to adjust the physical orientation of at least one of the plurality of components to alter the microwave emission of the vacuum electronic device. Alternatively, each of the plurality of sensors can be acoustic sensors configured to measure acoustic vibrations within the vacuum electronic device. Acoustic vibrations are caused by the microwave emission from an emitter in the vacuum electronic device.

An additional embodiment of the inventive subject matter is a method of enhancing performance of a vacuum electronic device. The method includes a) storing an optimal characteristic value on a storage medium in communication with a vacuum electronic device controller; b) placing a plurality of first sensors on an interior of the vacuum electronic device; c) using the plurality of first sensors to measure a characteristic of the vacuum electronic device to get a first measured characteristic value, wherein the first measured characteristic value is an average of measurements of the plurality of first sensors; d) comparing the first measured characteristic value to the optimal characteristic value, using the vacuum electronic device controller to physically reposition components of the vacuum electronic device then using the plurality of first sensors to measure a characteristic of the vacuum electronic device to get a second measured characteristic value, comparing the second measured value to the optimal characteristic value, and using the vacuum electronic device controller to physically reposition components of the vacuum electronic device; and e) repeating step d until the second measured value is within a predetermined percentage of the optimal characteristic value.

The method of enhancing performance of a vacuum electronic device can also include the steps of placing a plurality of second sensors on an exterior of the vacuum electronic device; using the plurality of second sensors to measure a characteristic of the vacuum electronic device to get a first exterior measured characteristic value, wherein the first exterior measured characteristic value is an average of each measurement of the plurality of second sensors; comparing the first exterior measured characteristic value to the optimal characteristic value, using said vacuum electronic device controller to physically reposition components of the vacuum electronic device then using said plurality of second sensors to measure a characteristic of the vacuum electronic device to get a second exterior measured characteristic value, comparing the second exterior measured value to the optimal characteristic value, and using the vacuum electronic device controller to physically reposition components of the vacuum electronic device; and repeating the previous step until the second exterior measured value is within a predetermined percentage of the optimal characteristic value.

With respect to the equipment used in any of these embodiments, at least one of the plurality of sensors used can be acoustic emission sensors. Also, the characteristic can be caused by emission of an RF signal from the vacuum electronic device or can be caused by any other type signal based upon the intended use of the device.

Other objects and goals of the present inventive subject matter will become apparent upon reading the following description in conjunction with the following figures.

BRIEF DESCRIPTION OF THE DRAWINGS

The inventive subject matter is herein described, by way of example only, with reference to the accompanying drawings, wherein.

DETAILED DESCRIPTION OF THE EMBODIMENTS

The present embodiments herein are not intended to be exhaustive and to limit in any way the scope of the inventive subject matter; rather they are used as examples for the clarification of the inventive subject matter and for enabling of others skilled in the art to utilize its teaching. The word "exemplary" is used herein to mean "serving as an example, instance, or illustration." Any embodiment described herein as "exemplary" is not necessarily to be construed as preferred or advantageous over other embodiments.

Figure 1:
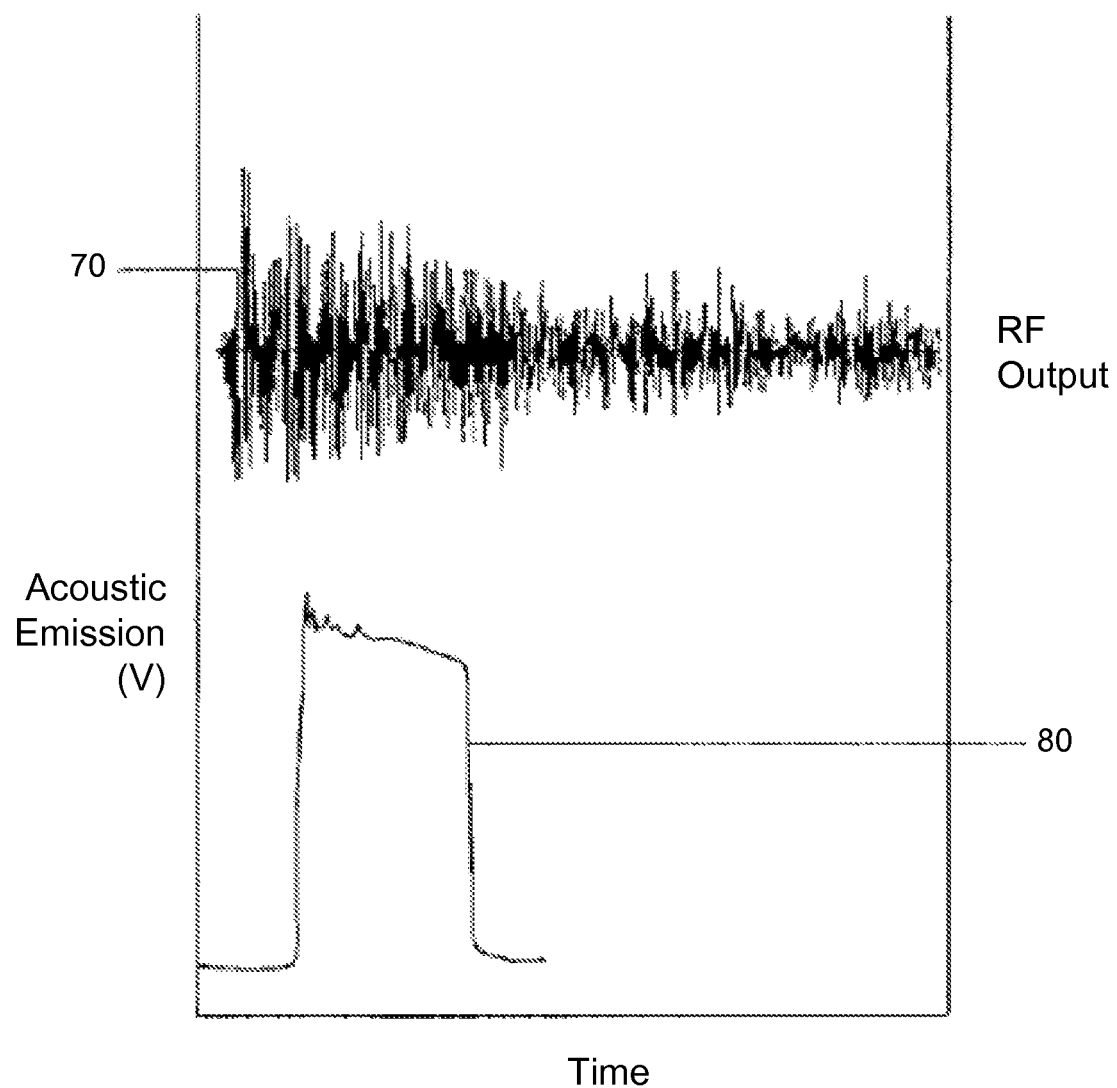
FIG. 1 is a graph showing the relationship between an RF output signal of a magnetron and a corresponding acoustic emission signal.

By way of example, an acoustic emission sensor may be used to monitor a 2J56 magnetron. FIG. 1 shows the output signal (in volts) 70 of the acoustic emission sensor when an RF signal 80 is emitted. This acoustic emission sensor can monitor changes in response to when a bad RF signal is emitted and also changes based on the location of the sensor and the correct alignment of the RF beam in an RF radiating device.

Figure 2:
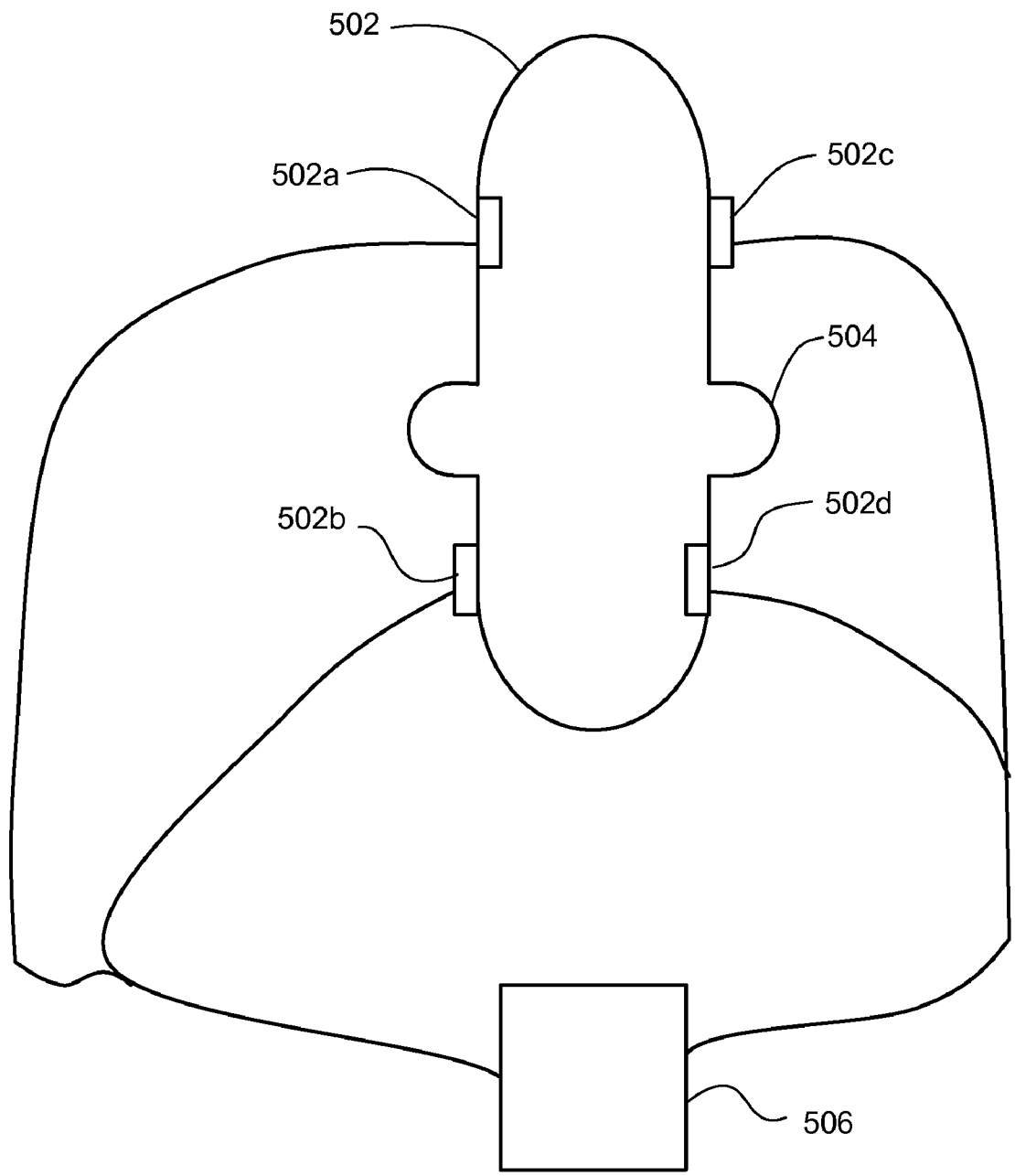
FIG. 2 is an example of a vacuum device having sensors placed in and on a wall of the device

With reference to FIG. 2, another example is to place acoustic emission sensors in a plurality of locations along, for example, a klystron 502. In this case, monitoring of acoustic emission may be used to enhance alignment of the beam during assembly by comparing characteristic acoustic signatures with known good values. In operation, a signal emitter 504 causes the klystron to vibrate. Sensors 502a-502d are placed on the inside and/or outside of the klystron to determine a characteristic klystron in operation such as a resonance frequency. The values obtained by each of the sensors 502a-502d are collected and analyzed by processor 506. The processor 506 can be configured to determine an average of the measurements from each of the sensors and can also determine if a particular sensor is producing a value that is abnormal in comparison to the other sensors. If the measured average value is outside the desired range of action an alert signal may be provided to an external device for notification or actuation of other devices such as automated positioning equipment.

Figure 3:
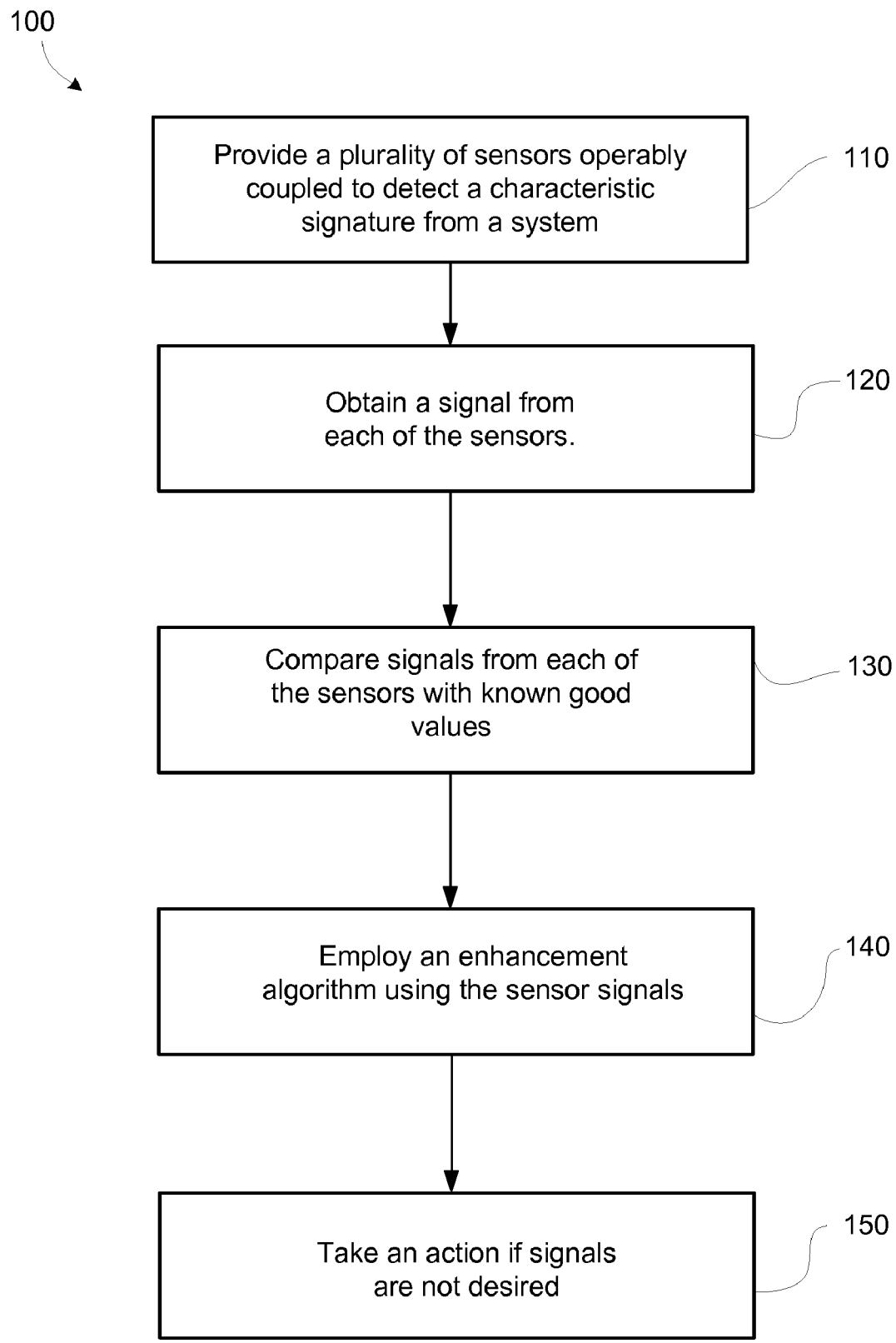
FIG. 3 is a flow chart showing steps of an inventive method disclosed herein.

FIG. 3 schematically shows the method for improved fabrication 100 using the sensor system. It includes the steps of: providing a plurality of sensors operably coupled to detect a characteristic signature from a system 110; obtaining a signal from each of the sensors 120; comparing the signals from each of the sensors with known good values 130; employing enhancement algorithms, if desired, using the sensor signals 140; and taking action if the signals are not desired 150. Action may include, for example, repositioning components, such as sidewalls, in system 110, repeating the process as desired, and actuating a response. The actuation of a response may be an automated adjustment system or an alarm mechanism to alert manual adjustment.

Figure 4:
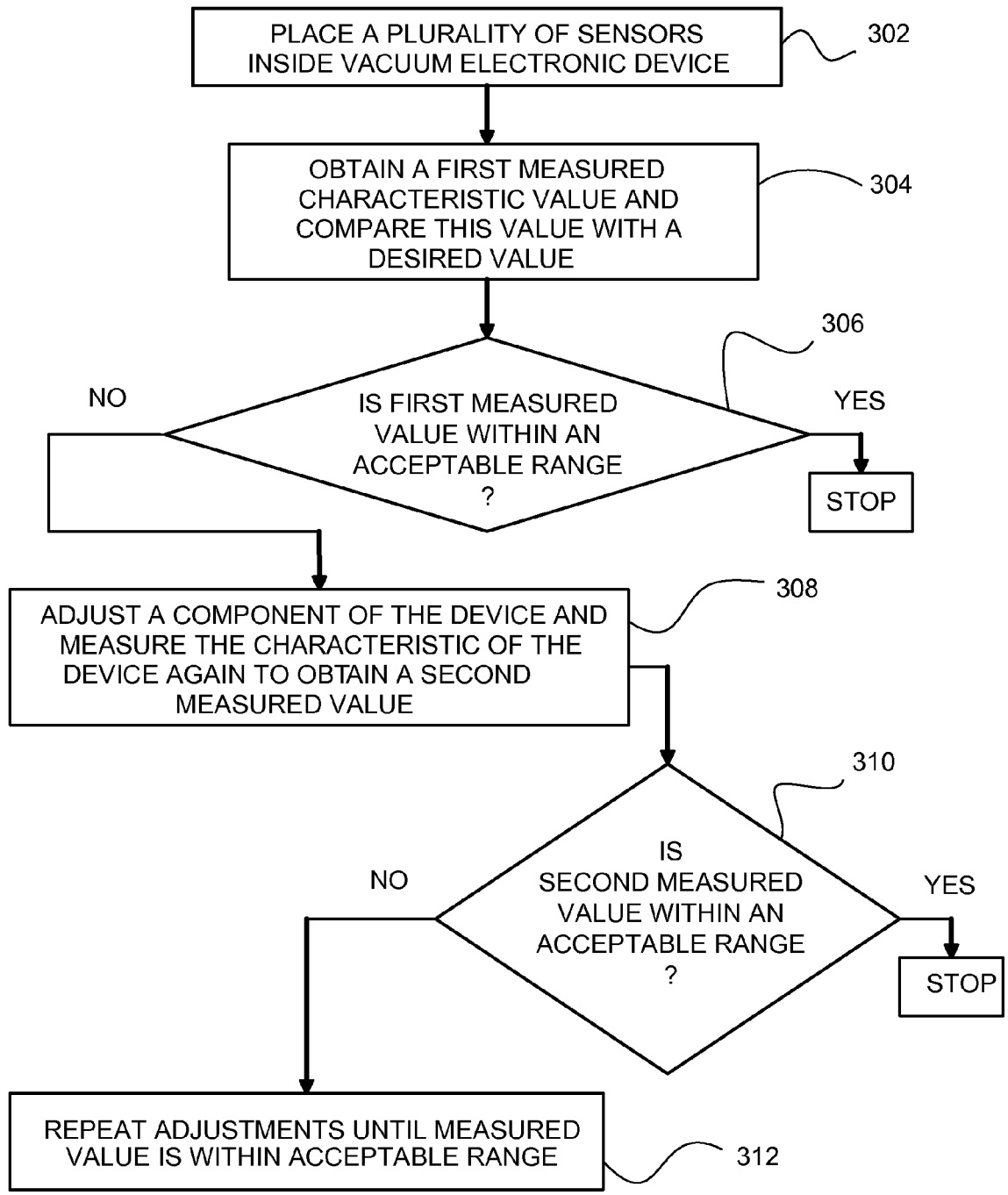
FIG. 4 is a flow chart showing steps of an alternative to the inventive method disclosed herein.

With reference to the flowchart in FIG. 4, a further method of improving efficiency of the process of manufacturing a vacuum electronic device includes the steps of placing a plurality of first sensors on an interior of the vacuum electronic device during construction of the vacuum electronic device at step 302 and, at step 304, measuring a characteristic to obtain a first measured characteristic value. The characteristic may include, for example, the frequency range of an acoustic emission signal, the amplitude of an acoustic emission signal, the spectral (frequency) components of an acoustic emission signal, or the integrated energy of an acoustic emission signal. At step 306 the method includes comparing the first measured characteristic value with a desired characteristic value and determining whether the first measured characteristic value is within a predetermined percentage of the desired characteristic value. As the objective of the sensors is to help improve the operability of the manufactured device, at step 308, the measured values are used to adjust at least one component of the vacuum electronic device to improve its construction. Any component of the vacuum electronic device can be measured such as, for example, the sidewalls of the device, the cavity of the device, the cathode, the anode, the collector, or any other component that can potentially affect the device's operation. The components that can be adjusted include any The same characteristic of the device is then again measured to obtain a second measured characteristic. Similar to step 306, at step 310, the second characteristic is compared with a desired characteristic value. The comparison is used to determine whether the second measured characteristic value is within a predetermined percentage, i.e., 5% of the desired characteristic value. At step 312, this adjustment and re-measuring is repeated until the second measured characteristic value is within the predetermined percentage of the desired characteristic value. Lastly, the sensors can be removed and the device's manufacture can be completed.

Also, to enhance the method, a plurality of second sensors are optionally placed on an exterior of the vacuum electronic device during construction of the vacuum electronic device. The plurality of second sensors measures a characteristic of the vacuum electronic device to obtain a characteristic value from an alternate point of view. Then, the exterior measured value is compared with a desired characteristic value to determine whether the exterior measured value is within a predetermined percentage of the desired value. If not, the electronic device is adjusted in an effort to improve its construction and operability. Then the characteristic value is measured again and, if necessary, the electronic device can be adjusted again.

The inventive subject matter can also be embodied in a system for maintaining operating efficiency of a vacuum electronic device having a plurality of components. The system includes a plurality of sensors disbursed throughout an interior of the vacuum electronic device (each of the plurality of sensors detects a characteristic level of the vacuum electronic device). A signal emitter is included in the device to create an acoustic emission signal in the vacuum electronic device. A controller receives from each of the plurality of sensors a value indicative of the characteristic level of the vacuum electronic device. For automated manufacturing processes, the controller also adjusts the physical orientation of at least one of the plurality of components to alter the characteristic level of the vacuum electronic device.

After manufacturing, the performance of the vacuum electronic device can be enhanced using a variation of the inventive subject matter. To execute the method an optimal operational characteristic of the device must be determined. Typically this is done experimentally. That optimal operational characteristic is stored on a storage medium for later reference. The characteristic is measured using at least one, but preferably multiple, sensors. The sensors are placed in the interior of the device. Optionally, additional sensors are also placed on an exterior of the device. To insure the integrity of the measurements, if multiple sensors are used, an average value of the aggregate of the signals from the sensors, both interior and exterior, may be derived. This average value can then be compared to the optimal operational characteristic. If the comparison is more than a preset percent difference, then the device can be adjusted in an attempt to reduce the difference. Of course, the lowest percent difference is the objective and for operational standards, a percent difference of 0.05% is preferable.

This invention provides a method and apparatus for improving the manufacturing and assembly process of vacuum microelectronic devices. It will reduce the workload by significantly reducing the amount of time needed to enhance device alignment. It also offers a way to automate the fabrication process and provides feedback to automated or robotic positioning equipment. This method can also be utilized during refurbishing where alignment and enhancement is often required.

This invention may be applied to any system, and may use any variety or plurality of sensors including but not limited to: electrical, magnetic, electromagnetic, thermal, acoustic, optical, ionizing radiation and chemical sensors. The parameters used in the enhancement algorithm may be selected for peak performance based on the specific device being monitored.

Referring again to FIG. 4, an example of this method includes the steps of a) placing a sensor on an interior of the vacuum electronic device during construction of the vacuum electronic device in a location where substantially no acoustic emission should be detectable if the vacuum electronic device is correctly manufactured. (See step 302) In this situation, it is believed that the absence of acoustic emission is associated with a correctly aligned RF propagating beam, which minimizes energy loss to the sidewalls. The exemplary method further comprises; b) measuring the integrated acoustic emission energy, to obtain a first measured integrated acoustic emission energy value; (See step 304) c) comparing the first measured integrated acoustic emission energy value with a desired integrated acoustic emission energy value of zero; (See step 304) d) determining whether the first measured integrated acoustic emission energy value is within an acceptable range of the desired characteristic value of zero; (See step 306) e) adjusting at least one component of the vacuum electronic device and measuring the integrated acoustic emission energy of the vacuum electronic device to obtain a second measured integrated acoustic emission energy, (See step 308) comparing the second measured integrated acoustic emission energy value with a desired integrated acoustic emission energy value of zero; (See step 310) f) determining whether the second measured integrated acoustic emission energy value is within an acceptable range of the desired integrated acoustic emission energy value; (See step 310) g) repeating step e until the second measured integrated acoustic emission energy value is within the within an acceptable range of the desired integrated acoustic emission energy value of zero; (See step 312) and h) removing the sensor and completing the process of manufacturing the vacuum electronic device. If the first measured integrated acoustic emission energy value is within an acceptable range of the optimal integrated acoustic emission energy value of zero, there is no need to continue measuring the integrated acoustic emission energy unless a person wishes to verify the first measurement.

The previous description of the disclosed embodiments is provided to enable any person skilled in the art to make or use the present inventive subject matter. Various modifications to these embodiments will be readily apparent to those skilled in the art, and the generic principles defined herein may be applied to other embodiments without departing from the spirit or scope of the inventive subject matter. For example, one or more elements can be rearranged and/or combined, or additional elements may be added. Thus, the present inventive subject matter is not intended to be limited to the embodiments shown herein but is to be accorded the widest scope consistent with the principles and novel features disclosed herein. It will be understood that many additional changes in the details, materials, steps and arrangement of parts, which have been herein described and illustrated to explain the nature of the invention, may be made by those skilled in the art within the principal and scope of the invention as expressed in the appended claims.

We claim:

1. A method of improving efficiency of manufacturing a vacuum electronic device comprising:
   a) placing a plurality of first sensors on an interior of the vacuum electronic device during construction of the vacuum electronic device and measuring an interior characteristic of said vacuum electronic device to obtain a first measured characteristic value;
   b) comparing said first measured characteristic value with a desired interior characteristic value;
   c) determining whether said first measured characteristic value is within a predetermined percentage of said desired interior characteristic value;
   d) adjusting at least one component of the vacuum electronic device and measuring the interior characteristic of said vacuum electronic device to obtain a second measured characteristic, comparing said second measured characteristic value with said desired interior characteristic value, and determining whether said second measured characteristic value is within said predetermined percentage of said desired interior characteristic value;
   e) repeating step d until said second measured characteristic value is within said predetermined percentage of said desired interior characteristic value;

f) removing said plurality of first sensors and completing manufacture of the vacuum electronic device; and g) placing a plurality of second sensors on an exterior of the vacuum electronic device during construction of the vacuum electronic device and measuring an exterior characteristic of said vacuum electronic device to obtain a first exterior measured characteristic value.

2. The method of improving efficiency of manufacturing a vacuum electronic device as recited in claim 1 further comprising:

b2) comparing said first exterior measured characteristic value with a desired exterior characteristic value;

c2) determining whether said first exterior measured characteristic value is within a predetermined percentage of said desired exterior characteristic value;

d2) adjusting at least one component of the vacuum electronic device and measuring the exterior characteristic of said vacuum electronic device to obtain a second exterior measured characteristic, comparing said second exterior measured characteristic value with a desired exterior characteristic value, determining whether said second exterior measured characteristic value is within a predetermined percentage of said desired exterior characteristic value;

e2) repeating step d2 until said second exterior measured characteristic value is within said predetermined percentage of said desired exterior characteristic value; and f2) removing said plurality of second sensors and completing the process of manufacturing the vacuum electronic device.

3. The method of improving efficiency of manufacturing a vacuum electronic device as recited in claim 2 wherein each of said plurality of first sensors is an acoustic emission sensor and each of said plurality of second sensors is an acoustic emission sensor.

4. The method as recited in claim 2 wherein said interior and exterior characteristics are caused by emission of an RF signal from said vacuum electronic device.

5. The method of improving efficiency of manufacturing a vacuum electronic device as recited in claim 1 wherein each of said plurality of first sensors is an acoustic emission sensor.

6. The method of improving efficiency of manufacturing a vacuum electronic device as recited in claim 1 wherein each of said plurality of second sensors is an acoustic emission sensor.

7. The method as recited in claim 1 wherein said interior characteristic and said exterior characteristic are caused by emission of an RF signal from said vacuum electronic device.

8. The method of improving efficiency of manufacturing a vacuum electronic device as recited in claim 1 wherein said interior characteristic and said exterior characteristic are selected from the group consisting of: a frequency range of an acoustic emission signal, an amplitude of an acoustic emission signal, spectral components of an acoustic emission signal, and integrated energy of an acoustic emission signal.

9. The method of improving efficiency of manufacturing a vacuum electronic device as recited in claim 1 wherein said interior and exterior characteristics are selected from the group consisting of: a frequency range of an acoustic emission signal, an amplitude of an acoustic emission signal, spectral components of an acoustic emission signal, and integrated energy of an acoustic emission signal.

\* \* \* \* \*